(12) United States Patent
Kisaki et al.

(10) Patent No.: US 11,116,077 B2
(45) Date of Patent: Sep. 7, 2021

(54) WIRING BOARD, ELECTRONIC DEVICE, AND ELECTRONIC MODULE

(71) Applicant: KYOCERA Corporation, Kyoto (JP)

(72) Inventors: Takuo Kisaki, Satsumasendai (JP); Keisuke Sawada, Satsumasendai (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/963,856

(22) PCT Filed: Jan. 23, 2019

(86) PCT No.: PCT/JP2019/002129
§ 371 (c)(1),
(2) Date: Jul. 22, 2020

(87) PCT Pub. No.: WO2019/146658
PCT Pub. Date: Aug. 1, 2019

(65) Prior Publication Data
US 2021/0045237 A1 Feb. 11, 2021

(30) Foreign Application Priority Data

Jan. 24, 2018 (JP) .............................. JP2018-009308

(51) Int. Cl.
*H05K 1/11* (2006.01)
*H05K 1/02* (2006.01)
*H05K 1/18* (2006.01)

(52) U.S. Cl.
CPC ............ *H05K 1/0296* (2013.01); *H05K 1/11* (2013.01); *H05K 1/183* (2013.01); *H05K 2201/10083* (2013.01)

(58) Field of Classification Search
CPC ................................................ H05K 1/11–119
See application file for complete search history.

(56) References Cited

U.S. PATENT DOCUMENTS

2014/0182920 A1* 7/2014 Yanagisawa ......... H05K 3/0035
174/266
2014/0251659 A1* 9/2014 Asano ...................... H05K 1/09
174/252

FOREIGN PATENT DOCUMENTS

JP  2005-209881 A  8/2005
JP  2013-214721 A  10/2013
WO  2017/090508 A1  6/2017

* cited by examiner

*Primary Examiner* — Jeremy C Norris
(74) *Attorney, Agent, or Firm* — Volpe Koenig

(57) ABSTRACT

A wiring board comprising an insulation substrate comprising a main surface and a penetrating portion that has an insulation property; and an external connection conductor, a portion of which is positioned in the insulation substrate and a different portion of which is exposed at the main surface, wherein the penetrating portion penetrates into the external connection conductor.

20 Claims, 2 Drawing Sheets

WIRING BOARD, ELECTRONIC DEVICE, AND ELECTRONIC MODULE

TECHNICAL FIELD

The present disclosure relates to a wiring board, an electronic device, and an electronic module.

BACKGROUND ART

Hitherto, there has existed a wiring board including an insulation substrate that includes a main surface, and an external connection conductor, a portion of which is exposed at the main surface of the insulation substrate. Patent Literature 1 discloses an electronic component accommodation package including such a wiring board. The electronic component accommodation package disclosed in Patent Literature 1 includes an external connection conductor and an insulation substrate, an electronic component mount portion disposed opposite to the main surface of the insulation substrate, and a frame portion that separates an external environment and the mount portion from each other.

In the electronic component accommodation package, the main surface of the insulation substrate corresponds to a mount surface that is mounted on a module substrate, and the external connection conductor corresponds to an electrode that is electrically connected to a wire of the module substrate (refer to International Publication No. 2017/090508).

SUMMARY OF INVENTION

Solution to Problem

A wiring board according to an aspect of the present disclosure comprises:

an insulation substrate comprising a main surface and a penetrating portion that has an insulation property; and an external connection conductor, a portion of which is positioned in the insulation substrate and a different portion of which is exposed at the main surface, wherein the penetrating portion penetrates into the external connection conductor.

An electronic device according to an aspect of the present disclosure comprises:

the wiring board; and an electronic component mounted on the wiring board.

An electronic module according to an aspect of the present disclosure comprises:

the electronic device; and a module substrate on which the electronic device is mounted.

Advantageous Effects of Invention

The wiring board according to the present disclosure is capable of increasing the adherence between the insulation substrate and the external connection conductor. The electronic device and the electronic module according to the present disclosure are capable of suppressing peeling of the external connection conductor of the wiring board that constitutes the electronic device.

DESCRIPTION OF EMBODIMENTS

An embodiment of the present disclosure is described in detail below with reference to the drawings.

Figure 1A:
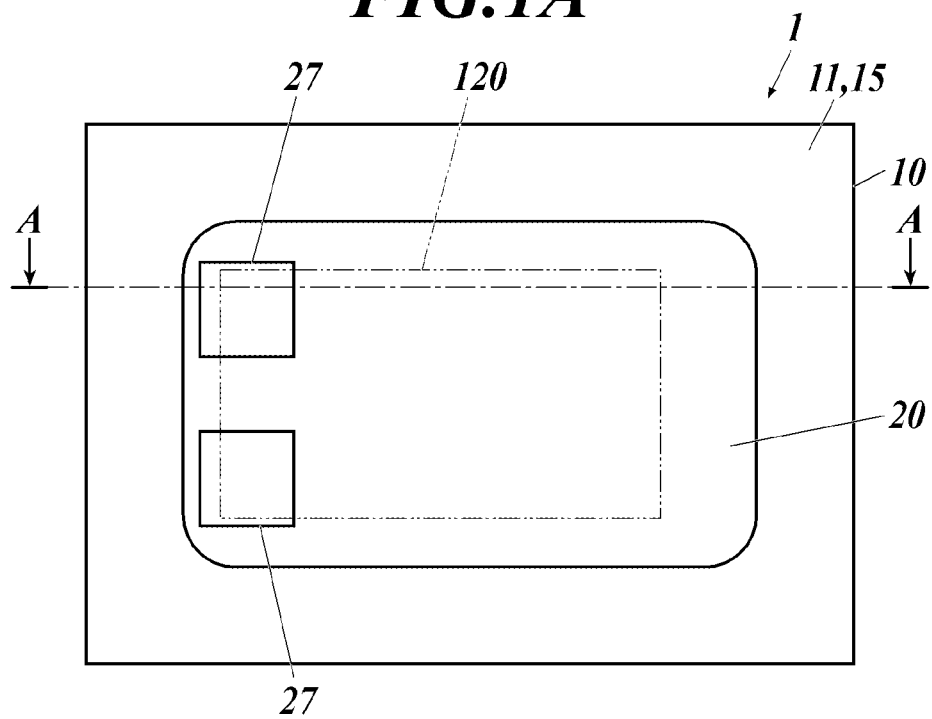
FIG. 1A is a plan view of an electronic component accommodation package according to an embodiment of the present disclosure.
Figure 1B:
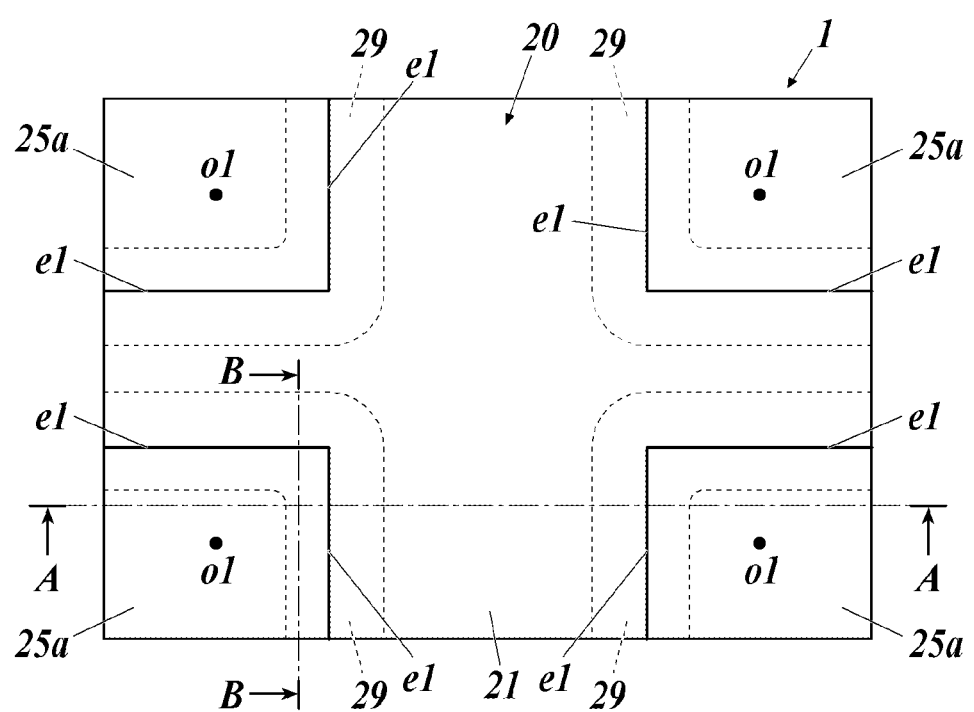
FIG. 1B is a back view of the electronic component accommodation package according to the embodiment of the present disclosure.
Figure 2A:
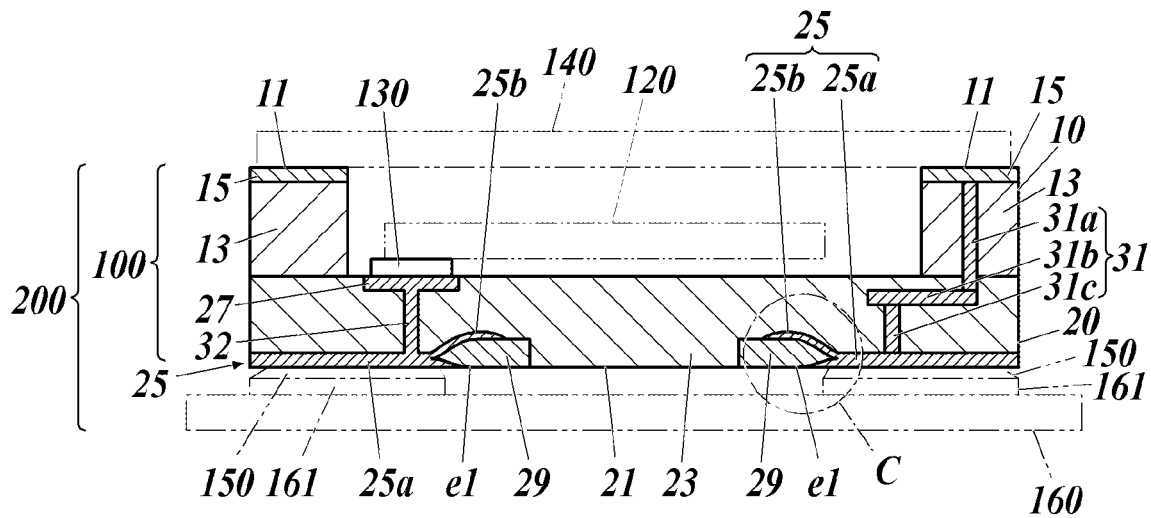
FIG. 2A is a sectional view along line A-A in FIG. 1A and FIG. 1B.
Figure 2B:
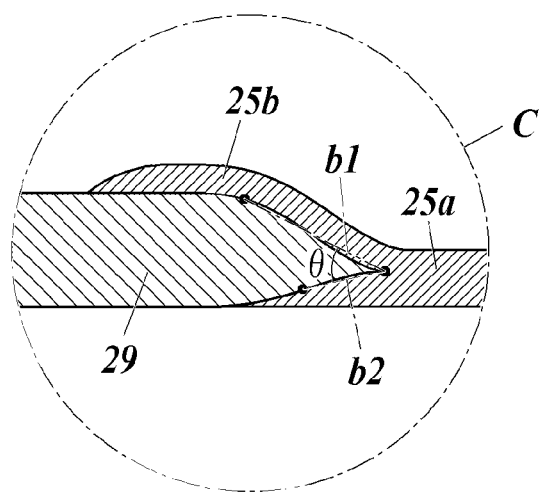
FIG. 2B is an enlarged view of a tip end portion of a penetrating portion in FIG. 2A.
Figure 3:
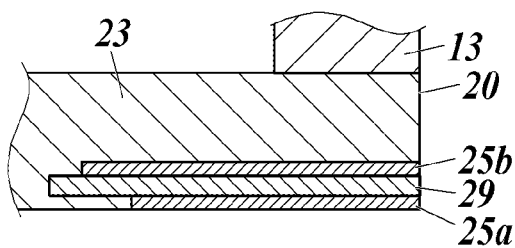
FIG. 3 is a sectional view along line B-B in FIG. 1B.

FIG. 1A is a plan view of an electronic component accommodation package according to an embodiment of the present disclosure. FIG. 1B is a back view of the electronic component accommodation package according to the embodiment of the present disclosure. FIG. 2A is a sectional view along line A-A in FIG. 1A and FIG. 1B. FIG. 2B is an enlarged view of a tip end portion of a penetrating portion in FIG. 2A. FIG. 3 is a sectional view along line B-B in FIG. 1B.

An electronic component accommodation package 1 according to an embodiment of the present disclosure includes a frame portion 10 including a first main surface 11 and a substrate portion 20 including a second main surface 21. The frame portion 10 includes an upper insulation layer 13, a frame-shaped metallized layer 15, and a wiring conductor 31. The substrate portion 20 includes a lower insulation layer 23, external connection conductors 25, connection pads 27, the wiring conductor 31, a through conductor 32, and penetrating portions 29. The first main surface 11 functions as a surface to which a cover body 140 (FIG. 2A) is joined, and the second main surface 21 functions as a mount surface that is mounted on a module substrate 160 (FIG. 2A). Of the structural elements above, the lower insulation layer 23 corresponds to an example of an insulation substrate according to the present disclosure. The substrate portion 20 corresponds to an example of a wiring board according to the present disclosure. The second main surface 21 corresponds to an example of a main surface according to the present disclosure.

The substrate portion 20 has the form of a plate, and has a mount portion where an electronic component 120 (FIG. 2A) is mounted thereon in a range of a center of a surface, which is opposite to the second main surface 21, of the substrate portion 20. In the example in FIG. 2A, a quartz vibrator (piezoelectric element) is mounted as the electronic component 120.

The lower insulation layer 23 is made of an insulation material, and has the form of a plate. As the insulation material, a ceramic material, such as an aluminum oxide based sintered body, an aluminum nitride sintered body, a mullite based sintered body, or a glass-ceramic sintered body, can be used.

Each external connection conductor 25 is a conductor, and includes a sheet-shaped conductor 25a that extends at the second main surface 21 and whose one surface is exposed to the outside, and a branch conductor 25b that branches off toward the inner side of the lower insulation layer 23 from a portion of its corresponding sheet-shaped conductor 25a. The substrate portion 20 includes four external connection conductors 25. As shown in FIG. 1B, the planar shape of each sheet-shaped conductor 25a is a quadrilateral shape, and the sheet-shaped conductors 25a are disposed at four corners of the lower insulation layer 23.

Each branch conductor 25b branches off toward the inner side of the lower insulation layer 23 from a position between a center o1 its corresponding sheet-shaped conductor 25a (see FIG. 1B) and two sides e1 of its corresponding sheet-shaped conductor 25a. Further, in plan view, each branch conductor 25b extends toward the sides e1 and is disposed up to positions beyond the sides e1. Here, the sides e1 are the sides that are closer to the center of the substrate portion 20. Each branch conductor 25b has a sectional shape shown in FIG. 2B extending along the two sides e1 of its corresponding sheet-shaped conductor 25a (also, see FIG. 3). An θ angle between each branch conductor 25b and a side-e1 edge portion of its corresponding sheet-shaped conductor 25a is an acute angle at a branch location between the branch conductor 25b and its corresponding edge portion. Each branch conductor 25b need not be disposed along the entire region of the two sides e1 of its corresponding sheet-shaped conductor 25a, and may be disposed along a region excluding a portion of the range. Each branch conductor 25b may be disposed without extending beyond the sides e1 in plan view.

Each penetrating portion 29 is made of an insulation material and penetrates into a location between the branch conductor 25b and its corresponding sheet-shaped conductor 25a. A tip end of each penetrating portion 29 forms an acute angle (angle θ) in a section perpendicular to the second main surface 21. Since the tip end of each penetrating portion 29 may have a finely rounded portion, the angle θ of the tip end of each penetrating portion 29 is defined as follows. That is, the angle θ is, in the section above, an angle between an approximate straight line b1 at a tip end side of a side where each branch conductor 25b and its corresponding penetrating portion 29 are in contact with each other and an approximate straight line b2 at a tip end side of a side where each sheet-shaped conductor 25a and its corresponding penetrating portion 29 are in contact with each other. Here, "a tip end side of a side" means closer to the tip end than a center point of the side, and "an approximate straight line" means a straight line obtained by the least-square method.

The tip end of each penetrating portion 29 is positioned at the branch location between the branch conductor 25b and the side-e1 edge portions of its corresponding sheet-shaped conductor 25a. Each penetrating portion 29 has a sectional shape shown in FIG. 2B extending along the two sides e1 of its corresponding sheet-shaped conductor 25a. That is, when viewed in a direction perpendicular to the second main surface 21, each penetrating portion 29 is positioned in the entire region of the sides e1 of its corresponding sheet-shaped conductor 25a. FIG. 1B shows each penetrating portion 29 by a broken line. Although as the insulation material of each penetrating portion 29, aluminum oxide (alumina) sintered body can be used, a ceramic material, such as an aluminum oxide based sintered body, an aluminum nitride sintered body, a mullite based sintered body, or a glass-ceramic sintered body, may also be used. Each penetrating portion 29 has insulation properties, and constitutes a portion of the lower insulation layer 23.

Each connection pad 27 is a part where the electronic component 120 is connected thereto via a conductive joining material 130, such as solder, is constituted by a conductor, and is exposed at the mount portion at its surface that is opposite to the second main surface 21.

The through conductor 32 extends through the lower insulation layer 23 and is electrically connected to the connection pads 27 and any one of the four external connection conductors 25.

The upper insulation layer 13 is made of an insulation material, and surrounds the mount portion where the electronic component 120 is mounted and separates the mount portion and an external environment from each other. As the insulation material, insulation materials that are the same as those of the lower insulation layer 23 above can be used. The upper insulation layer 13 has a planar end surface that is opposite to the substrate portion 20.

The frame-shaped metallized layer 15 is a conductor and extends over the end surface of the upper insulation layer 13. An upper surface (a surface that is opposite to the second main surface 21) of the frame-shaped metallized layer 15 constitutes the first main surface 11. Edge portions of the cover body 140 can be joined to the first main surface 11.

The wiring conductor 31 is a conductor, and extends in the upper insulation layer 13 and the lower insulation layer 23 and is electrically connected to the frame-shaped metallized layer 15 and any of the four external connection conductors 25. The wiring conductor 31 includes a relay conductor 31b that extends in a direction parallel to the second main surface 21 in the lower insulation layer 23, a through conductor 31a that connects the frame-shaped metallized layer 15 and the relay conductor 31b to each other, and a through conductor 31c that connects the relay conductor 31b and the external connection conductor 25 to each other.

In the electronic component accommodation package 1, the electronic component 120 is mounted on the mount portion of the substrate portion 20, and the cover body 140 is joined to an upper portion of the frame portion 10 and covers an opening of the frame portion 10, so that an electronic device 100 is one including the electronic component 120 hermetically sealed therein. As a specific example, a quartz vibrator is mounted as the electronic component 120, and a quartz oscillator is constituted as the electronic device 100. The electronic device 100 is mounted on the module substrate 160 to constitute an electronic module 200. The sheet-shaped conductors 25a of the electronic device 100 are joined to electrode pads 161 of the module substrate 160 via a conductive joining material 150, such as solder, as a result of which the electronic device 100 is mounted on the module substrate 160.

In manufacturing the electronic component accommodation package 1, first, by using a ceramic green sheet before sintering, a metalized paste, and an alumina paste, a molded part having a structure and a shape corresponding to those of the frame portion 10 and the substrate portion 20 is formed. Here, a portion corresponding to the upper insulation layer 13 of the frame portion 10 and the lower insulation layer 23 of the substrate portion 20 is formed by using the ceramic green sheet. A portion corresponding to the frame-shaped metallized layer 15, the wiring conductor 31, the through conductor 32, the external connection conductors 25, and the connection pads 27 is formed by using the metallized paste. A portion corresponding to the penetrating portions 29 is formed by using the alumina paste. By firing the molded part, the electronic component accommodation package 1 is manufactured.

As described above, according to the substrate portion 20 of the electronic component accommodation package 1 of the present embodiment, the penetrating portions 29 are disposed in the lower insulation layer 23, and each penetrating portion 29 penetrates into a portion of its corresponding external connection conductor 25. This makes it possible to suppress the external connection conductors 25 from being peeled from the lower insulation layer 23. Further, in the section perpendicular to the second main surface 21, the tip end of each penetrating portion 29 forms an acute angle (angle θ). Therefore, by causing each penetrating portion 29 to penetrate into its corresponding external connection conductor 25, a strong force that suppresses peeling of the external connection conductors 25 can be obtained.

According to the substrate portion 20 of the electronic component accommodation package 1 of the present embodiment, each external connection conductor 25 includes the sheet-shaped conductor 25a and the branch conductor 25b. Each penetrating portion 29 is interposed between the sheet-shaped conductor 25a and the branch conductor 25b. Therefore, a stronger force that suppresses peeling of the sheet-shaped conductors 25a is obtained. Further, since each penetrating portion 29 is disposed in the entire region of the sides e1 of its corresponding sheet-shaped conductor 25a, peeling can be suppressed in the entire region of the sides e1 of its corresponding sheet-shaped conductor 25a.

According to the electronic device 100 of the present embodiment and the electronic module 200 including the electronic device 100 mounted on the module substrate 160, it is possible to suppress peeling of the external connection conductors 25 of the electronic device 100.

An embodiment of the present disclosure has been described above. However, the embodiment above is an exemplification and can be modified in various ways. For example, in the embodiment above, as the penetrating portions included in the insulation substrate, the penetrating portions 29 made of a material that is separate from the material of the lower insulation layer 23 are described. However, the penetrating portions may be made of a material that is identical to the insulation substrate and integrated with the insulation substrate. The ranges in which the penetrating portions or the branch portions of the external connection conductors are disposed may be along the entire region of the sides e1 of the sheet-shaped conductors or along only a portion of the respective ranges. Further, the penetrating portions or the branch portions may be disposed along a side opposite to the sides e1 disposed closer to the center. Although, in the embodiment above, the wiring board including four external connection conductors is described, the wiring board may include one external connection conductor or a plurality of external connection conductors other than four external connection conductors.

Although in the embodiment above, as a structure including the wiring board, the electronic component accommodation package 1 including the substrate portion 20 and the frame portion 10 is described, the wiring board may have a plate-shaped structure not including a frame portion 10. The substrate portion 20 and the frame portion 10 in combination may be called a wiring board. Although, in the embodiment above, a quartz vibrator is described as the electronic component, various other modifications, such as a semiconductor device, a capacitor, an inductor, or a resistor can be used as the electronic component. Other details of the embodiment can be changed as appropriate without departing from the spirit of the present disclosure.

INDUSTRIAL APPLICABILITY

The present disclosure can be used in an electronic component accommodation package, an electronic device, and an electronic module.

The invention claimed is:
1. A wiring board comprising:
an insulation substrate comprising a main surface and a penetrating portion that has an insulation property; and
an external connection conductor, a portion of which is positioned in the insulation substrate and a different portion of which is exposed at the main surface, the entire external connection conductor embedded within the insulation substrate,
wherein the penetrating portion is embedded within the insulation substrate and penetrates into the external connection conductor.

2. The wiring board according to claim 1, wherein a tip end of the penetrating portion forms an acute angle in a section perpendicular to the main surface.

3. The wiring board according to claim 2, wherein the external connection conductor further comprises a sheet-shaped conductor that is positioned at the main surface and a branch conductor that branches off toward an inner side of the insulation substrate from a portion of the sheet-shaped conductor, and
further wherein the penetrating portion is interposed between the sheet-shaped conductor and the branch conductor.

4. The wiring board according to claim 3, wherein the sheet-shaped conductor has a quadrilateral shape, and
the penetrating portion is positioned in an entire region of a side of the sheet-shaped conductor when viewed in a direction perpendicular to the main surface.

5. An electronic device comprising:
the wiring board according to claim 4; and
an electronic component mounted on the wiring board.

6. An electronic module comprising:
the electronic device according to claim 5; and
a module substrate on which the electronic device is mounted.

7. An electronic device comprising:
the wiring board according to claim 3; and
an electronic component mounted on the wiring board.

8. An electronic module comprising:
the electronic device according to claim 7; and
a module substrate on which the electronic device is mounted.

9. An electronic device comprising:
the wiring board according to claim 2; and
an electronic component mounted on the wiring board.

10. An electronic module comprising:
the electronic device according to claim 9; and
a module substrate on which the electronic device is mounted.

11. The wiring board according to claim 1, wherein the external connection conductor further comprises a sheet-shaped conductor that is positioned at the main surface and a branch conductor that branches off toward an inner side of the insulation substrate from a portion of the sheet-shaped conductor, and
further wherein the penetrating portion is interposed between the sheet-shaped conductor and the branch conductor.

12. An electronic device comprising:
the wiring board according to claim 11; and
an electronic component mounted on the wiring board.

13. An electronic module comprising:
the electronic device according to claim 12; and
a module substrate on which the electronic device is mounted.

14. The wiring board according to claim 11, wherein the sheet-shaped conductor has a quadrilateral shape, and
the penetrating portion is positioned in an entire region of a side of the sheet-shaped conductor when viewed in a direction perpendicular to the main surface.

15. An electronic device comprising:
the wiring board according to claim 14; and
an electronic component mounted on the wiring board.

16. An electronic module comprising:
the electronic device according to claim 15; and
a module substrate on which the electronic device is mounted.

17. An electronic device comprising:
the wiring board according to claim 1; and
an electronic component mounted on the wiring board.

18. An electronic module comprising:
the electronic device according to claim 17; and
a module substrate on which the electronic device is mounted.

19. The wiring board according to claim 1, wherein the exposed portion of the external connection conductor is positioned at a same plane as the main surface of the insulation substrate.

20. The wiring board according to claim 1, wherein the penetrating portion is positioned at a same plane as the main surface of the insulation substrate.

* * * * *